United States Patent
Summers et al.

(10) Patent No.: US 10,630,324 B1
(45) Date of Patent: Apr. 21, 2020

(54) SYSTEM FOR VOLTAGE STANDING WAVE RATIO (VSWR) MEASUREMENT

(71) Applicant: QUALCOMM Incorporated, San Diego, CA (US)

(72) Inventors: Andrew Summers, Lawshall (GB); Chi-Fung Kwok, London (GB); Oleg Popov, Cambridge (GB); Bahareh Siasi, Cambridge (GB); William Daniel Connolley, Cambridge (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/250,165

(22) Filed: Jan. 17, 2019

(51) Int. Cl.
| | |
|---|---|
| *H04B 1/16* | (2006.01) |
| *H04B 1/04* | (2006.01) |
| *H03F 3/24* | (2006.01) |
| *H03F 1/56* | (2006.01) |

(52) U.S. Cl.
CPC ........... *H04B 1/0458* (2013.01); *H03F 1/565* (2013.01); *H03F 3/245* (2013.01); *H04B 1/04* (2013.01); *H03F 2200/102* (2013.01); *H03F 2200/336* (2013.01); *H03F 2200/387* (2013.01); *H03F 2200/451* (2013.01); *H03F 2200/462* (2013.01); *H04B 2001/0408* (2013.01)

(58) Field of Classification Search
CPC ......... H04B 1/04; H04B 1/0458; H03F 1/565; H03F 3/245; H03F 3/19; H03F 3/195
See application file for complete search history.

(56) References Cited

U.S. PATENT DOCUMENTS

| | | | | |
|---|---|---|---|---|
| 2009/0015324 A1* | 1/2009 | Magoon | .................... | H03F 3/19 330/135 |
| 2011/0057712 A1* | 3/2011 | Bowers | .................... | H03F 3/195 327/419 |
| 2014/0285262 A1* | 9/2014 | Kojima | .................... | H03F 1/56 330/127 |
| 2018/0316312 A1* | 11/2018 | Sharma | .................... | H03F 3/245 |

* cited by examiner

*Primary Examiner* — Thanh C Le
(74) *Attorney, Agent, or Firm* — Patterson & Sheridan, L.L.P.

(57) ABSTRACT

Certain aspects of the present disclosure generally relate to apparatus and techniques for wireless communication. One example apparatus generally includes an antenna terminal, an amplifier, a matching network coupled between the antenna terminal and an output of the amplifier, a first voltage envelope detector coupled to a node between the antenna and the matching network, and a current detection circuit coupled to the amplifier.

19 Claims, 5 Drawing Sheets

SYSTEM FOR VOLTAGE STANDING WAVE RATIO (VSWR) MEASUREMENT

TECHNICAL FIELD

Certain aspects of the present disclosure generally relate to electronic circuits and, more particularly, to methods and apparatus for measuring voltage standing wave ratio (VSWR).

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more transmitters.

At least one of these transmitters may be implemented as a polar transmitter. A polar transmitter may assist a power amplifier in radio frequency (RF) front-end circuitry to exhibit better performance. In the polar structure, in-phase/quadrature (I/Q) signals are polarized into magnitude and phase signals. The magnitude and phase signals are then used to generate signals for transmission via the power amplifier.

SUMMARY

Certain aspects of the present disclosure generally relate to methods and apparatus for measuring the magnitude and angle of a voltage standing wave ratio (VSWR), such as the VSWR associated with a polar transmitter.

Certain aspects of the present disclosure are directed to an apparatus for wireless communication. The apparatus generally includes an antenna terminal, an amplifier, a matching network coupled between the antenna terminal and an output of the amplifier, a first voltage envelope detector coupled to a node between the antenna terminal and the matching network, and a current detection circuit coupled to the amplifier.

Certain aspects of the present disclosure are directed to a method for wireless communication. The method generally includes amplifying an input signal for transmission via an antenna, detecting an envelope voltage at the antenna during the transmission, detecting a current supplied to the antenna during the transmission, and adjusting one or more parameters associated with the transmission based on the envelope voltage and the current.

Certain aspects of the present disclosure are directed to an apparatus for wireless communication. The apparatus generally includes means for amplifying an input signal for transmission via an antenna, means for detecting an envelope voltage at the antenna during the transmission, means for detecting a current supplied to the antenna during the transmission, and means for adjusting one or more parameters associated with the transmission based on the envelope voltage and the current.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
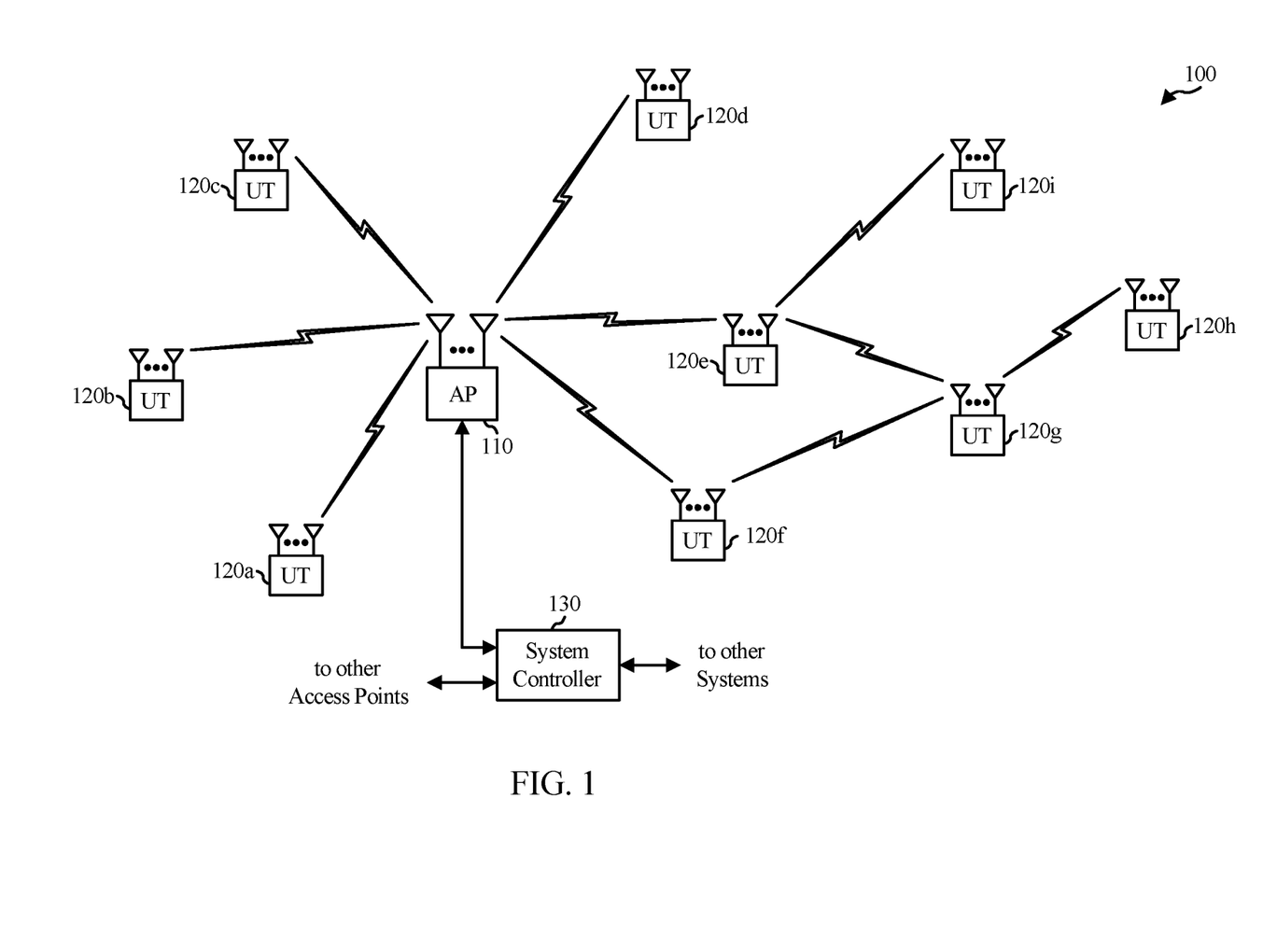
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_{ut}$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a polar transmitter, as described in more detail herein.

Figure 2:
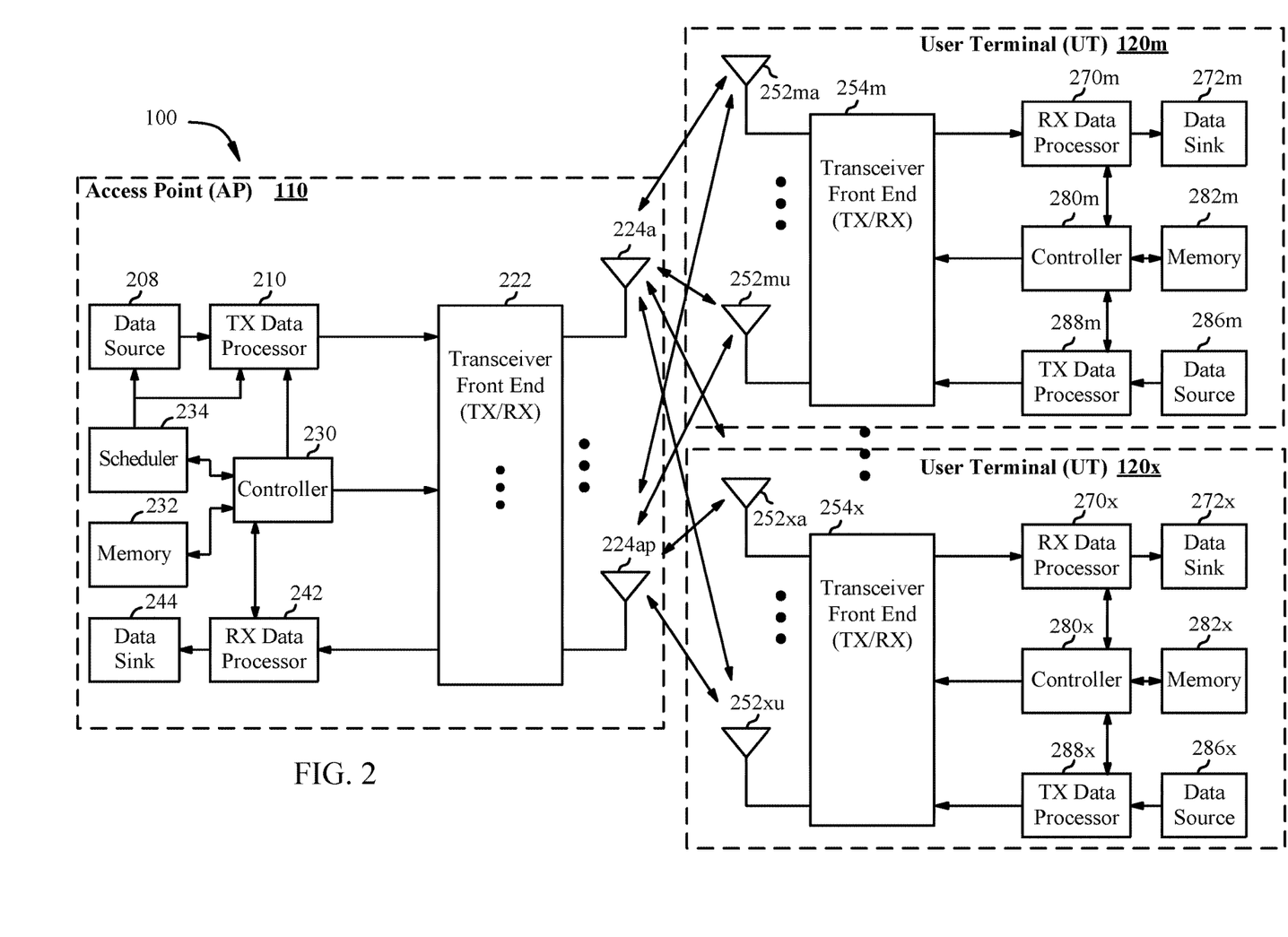
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a polar transmitter, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222.

Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

While FIGS. 1-2 provide a wireless communication system as an example application in which certain aspects of the present disclosure may be implemented to facilitate understanding, certain aspects described herein may be used in any of various other suitable systems.

System for Voltage Standing Wave Ratio (VSWR) Measurement

In wireless communication systems, it is desirable to transform the output load impedance of a transmitter to an impedance that increases the efficiency of the power amplifier, depending on the available voltage and current swing, and class of operation. Deviation from an optimum condition may be characterized by a reflection coefficient or voltage standing wave ratio (VSWR), referenced to the characteristic load impedance (often 50Ω).

Certain environmental effects may cause the load impedance to change, altering the impedance presented to the power amplifier, and consequently, altering the transmitted power and power amplifier efficiency. In order to avoid the adverse impacts of load impedance variation, the transmitter load VSWR may be monitored, based on which characteristics of the transmitter may be adjusted accordingly, as described in more detail herein. VSWR generally refers to the ratio of the maximum and minimum voltages (or currents) of the standing wave in a transmission line of a given characteristic impedance, which is a result of the observed impedance varying along the transmission line's length due to a mismatched load, although VSWR may also be used to describe mismatch from a given operating impedance. When the load is matched to the characteristic impedance of the transmission line, the observed impedance may be constant, giving rise to constant voltage and current, and a VSWR of 1. On the other hand, when there is mismatch, VSWR becomes larger than 1.

Transmitters may be designed to deliver power into a load having a specific load impedance (e.g., 50 ohms). Deviation from the specified load condition may result in an increase or decrease in power delivered to the load and an increase or decrease in transmitted harmonic power, both of which may have regulatory implications for radiated power. The deviation of the load condition may also result in a change in the amplitude modulation (AM)-to-AM (AM-AM) or AM-to-phase modulation (PM) (AM-PM) characteristics of the power amplifier (PA), which may adversely impact the transmitted adjacent channel power. The load condition deviation may also result in a change in the phase of unwanted coupling between an output of the PA and a source voltage-controlled oscillator (VCO), which may result in an increase (or decrease) in the frequency pulling of the VCO and have an adverse impact on the transmitted error vector magnitude.

Similarly, receivers may be designed to be driven from a certain source impedance. Deviation from the specified source impedance may result in an increase or decrease in voltage gain, increase or decrease in noise figure, and increase or decrease in linearity. In mixer-first applications (e.g., a receiver implemented without a low-noise amplifier (LNA) between a mixer and the antenna), deviation from the specified source impedance may alter the resistive-capacitive (RC) filter bandwidth formed by the source impedance, the mixer switch on-resistance, and the post-mixer sampling capacitor. This may result in usage of excess bandwidth, reducing the effectiveness of mixer-first resilience to off-channel blockers.

Transmitters and receivers may be designed to work satisfactorily into a load resulting from a narrowband antenna and possibly one or more filters. Thus, additional margin may be built into the design of the receiver, leading to increased direct-current (DC) power consumption and/or reduced performance. Certain aspects of the present disclosure are directed to measuring load and source impedances, and adjusting transmitter and receiver configurations, such as reducing transmit power, altering the output or input matching network to maintain a constant source impedance, or adjusting a sampling capacitor value in the mixer-first application to maintain lower bandwidth.

Although typically VSWR is calculated as a scalar quantity, VSWR may also be calculated as a vector quantity using the following equation:

$$VSWR = \frac{1+\Gamma}{1-\Gamma}$$

where $\Gamma$ is the reflection coefficient representing the impedance mismatch and where $\Gamma$ retains its phase, as described herein. With the VSWR having a vector quantity, the actual impedance (Z) of a load may be calculated by multiplying the VSWR by the characteristic impedance (Zo) of the load. In other words, if the VSWR can be measured including its phase, the transmit (Tx) load impedance can be calculated. The actual impedance of the load detected for transmission may be the same as the source impedance for reception due to reciprocity of antennas.

Figure 3A:
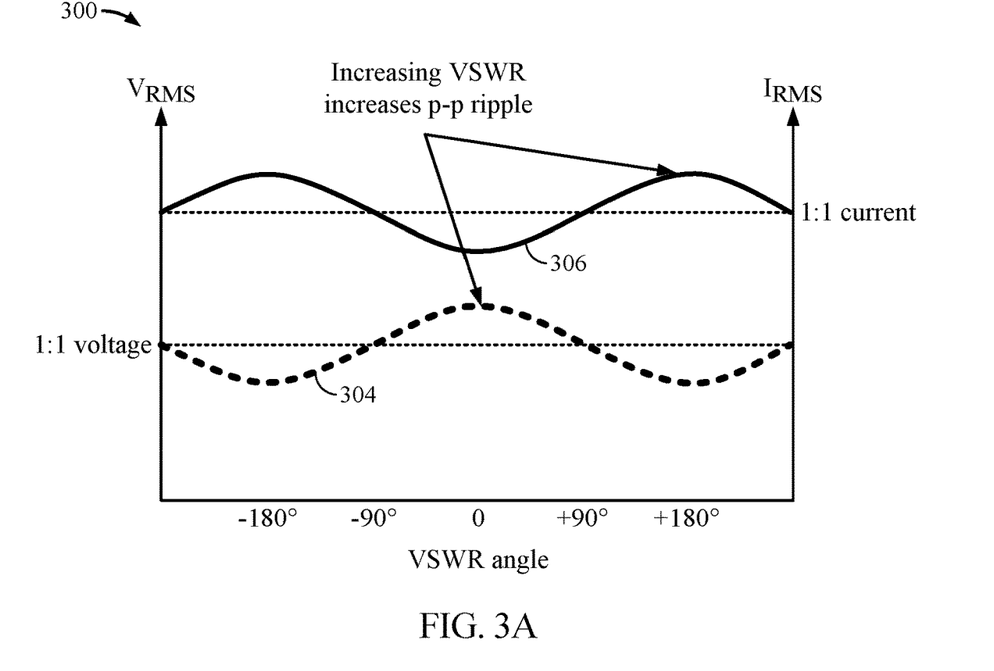
FIGS. 3A and 3B are graphs showing load voltage and current as a function of voltage standing wave ratio (VSWR) angle, in accordance with certain aspects of the present disclosure.
Figure 3B:
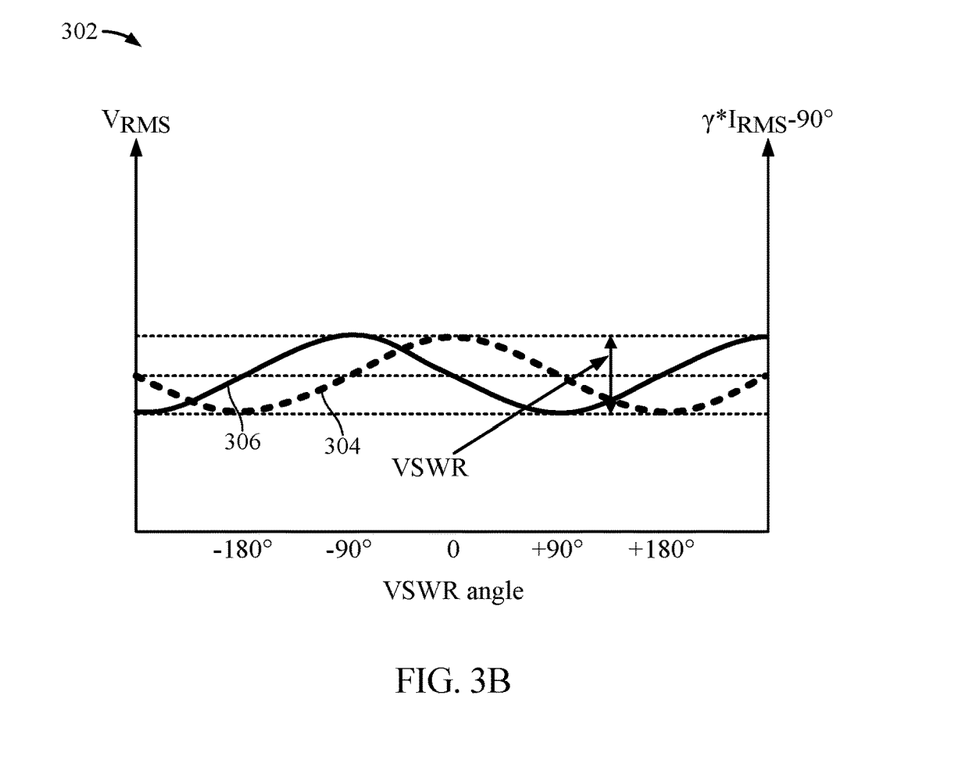

FIGS. 3A and 3B illustrate graphs 300, 302 showing load voltage 304 (e.g., root mean square (RMS) voltage) and current 306 (e.g., RMS current) as a function of VSWR angle, in accordance with certain aspects of the present disclosure. As illustrated in FIG. 3A, at the same plane of reference, the voltage and current vary in antiphase with VSWR to maintain the same output power (Pout). As illustrated in FIG. 3A, at certain VSWR angles (e.g., ±90°), there may be no change in voltage or current with VSWR magnitude, and therefore, it may not be possible to reliably measure VSWR at these VSWR angles. However, if the measurement of current is made at a plane of reference that is 90° shifted from the voltage measurement, the measurement of VSWR magnitude may be constant with VSWR angle, as illustrated in FIG. 3B. In FIG. 3B, the current measurement of the load is delayed by 90° and scaled (e.g., by a scalar quantity (γ)) to equal the voltage value, as illustrated.

Figure 4:
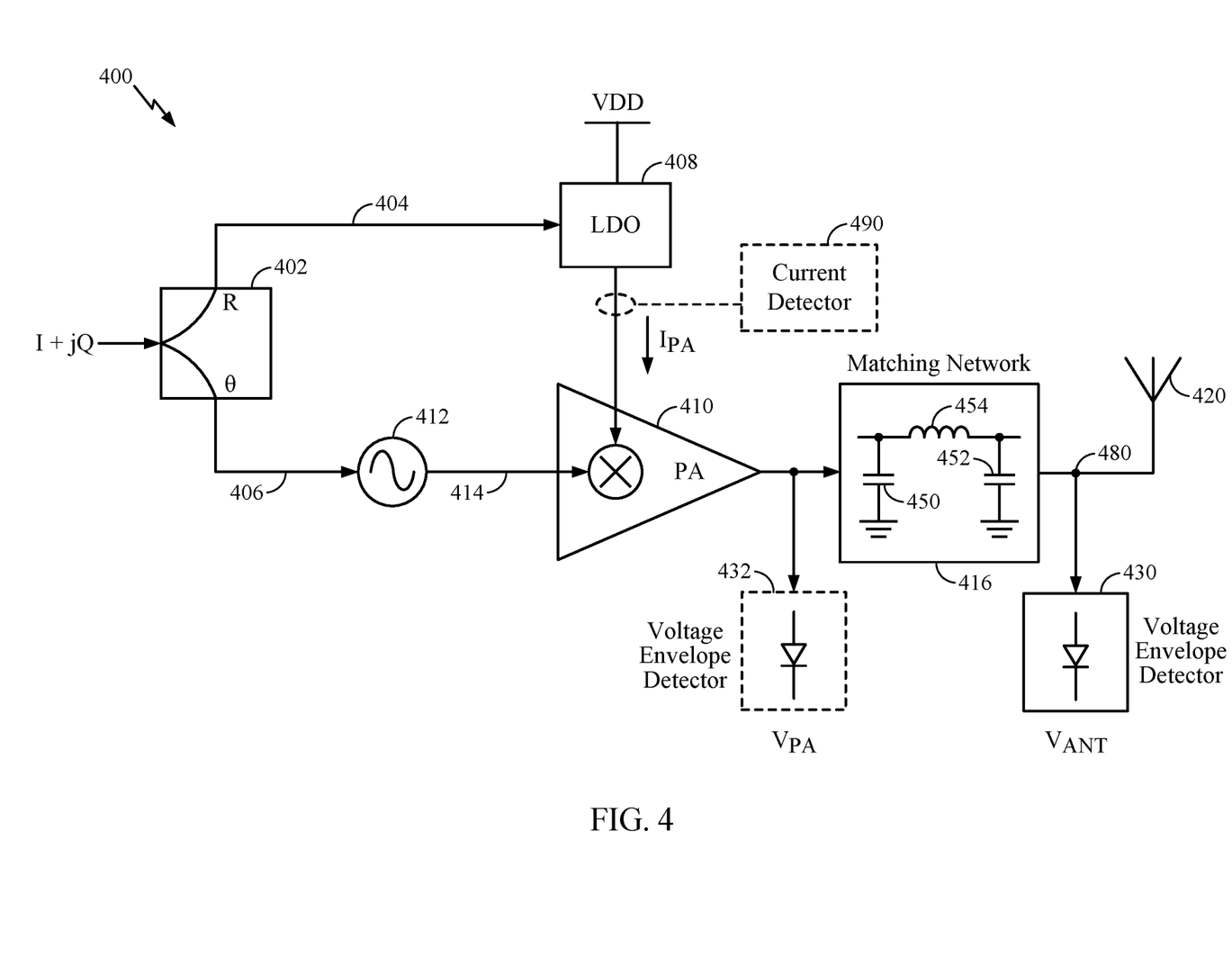
FIG. 4 is an example polar transmitter in an example transceiver front end, in accordance with certain aspects of the present disclosure.

FIG. 4 is an example polar transmitter 400 which may be implemented in a transceiver front end, such as transceiver front ends 222, 254 in FIG. 2, in accordance with certain aspects of the present disclosure. The transceiver front end may include a baseband module for generating a baseband signal having in-phase (I) and quadrature (Q) components (I+jQ). The baseband signal may be provided to a polar processor 402 which may generate a magnitude signal 404 and a phase signal 406, as illustrated.

The magnitude signal 404 (also referred to as an amplitude component) is provided to a magnitude modulator circuit, which may be implemented using a low dropout (LDO) regulator 408. The LDO regulator 408 generates a magnitude control signal (e.g., PA supply voltage ($V_{PA}$)). Since the PA 410 is a highly efficient switching-type amplifier (e.g., inverse class D), $I_{PA}$ is proportional to $V_{PA}$. Thus, magnitude control signal 404 is able to linearly modulate the magnitude of the amplified signal generated at the output of the PA 410.

The phase signal 406 is provided to a phase modulator, which may be implemented as a phase-locked loop (PLL) 412 having a VCO. The PLL 412 generates a radio-frequency (RF) signal 414 which is amplified by the PA 410 to generate an amplified signal at the output of the PA 410.

In a polar transmitter, the amplitude component modulates the PA voltage. The PA 410 may have little to no quiescent current, and is therefore, more efficient than other types of transmitters (e.g., class AB amplifiers used in Cartesian schemes, such as I/Q schemes). A unique property of polar transmitters is therefore that the LDO current ($I_{PA}$) generated by the LDO regulator 408 is directly proportional to the current delivered to the load. Therefore, a current detector 490 may be used to detect the LDO current, which may be used for determining a VSWR of the polar transmitter 400, as described in more detail herein. In certain aspects, the current detector 490 may be implemented as a replica output stage of the LDO regulator 408.

In certain aspects, a matching network 416 may be implemented between the output of the PA 410 and an antenna terminal 480 coupled to the antenna 420 for impedance matching. The matching network 416 may be implemented using a pi-network (also referred to as a π-network) having capacitive elements 450, 452 and an inductive element 454, as illustrated. At least one of the capacitive elements 450, 452 and the inductive element 454 may be tunable in order to adjust the impedance of the matching network 416. A highly efficient polar transmitter 400 has high output impedance, which requires the pi-network to operate at or close to resonance. Thus, the matching network 416 may nominally provide the 90° phase shift desired for VSWR measurement, as described with respect to FIGS. 3A and 3B.

In certain aspects, the polar transmitter 400 may include a voltage envelope detector 430 (e.g., implemented as a rectifier circuit) for detecting an envelope voltage at the antenna, which together with the LDO current ($I_{PA}$) may be used to determine the VSWR. Based on the VSWR, one or more parameters of the polar transmitter 400 may be adjusted. For example, the antenna matching via the matching network 416 may be adjusted by adjusting the capacitance of at least one of the capacitive elements 450, 452 of the matching network 416, or the VSWR measurement may be used to mitigate the effects of VSWR on transmitter or receiver performance. In certain aspects, adjustment of the matching network 416 may be controlled by a controller, such as the controller 230 of FIG. 2.

In certain aspects, a voltage envelope detector 432 may be implemented at the output of the PA 410, which may be used as a proxy for the current measurement. In other words, instead of measuring the LDO current ($I_{PA}$), the voltage at the output of the PA 410 may be detected via the voltage envelope detector 432, which together with the voltage at the antenna 420 detected by the voltage envelope detector 430, may be used to calculate the load current assuming the impedance of the matching network 416 is known.

Figure 5:
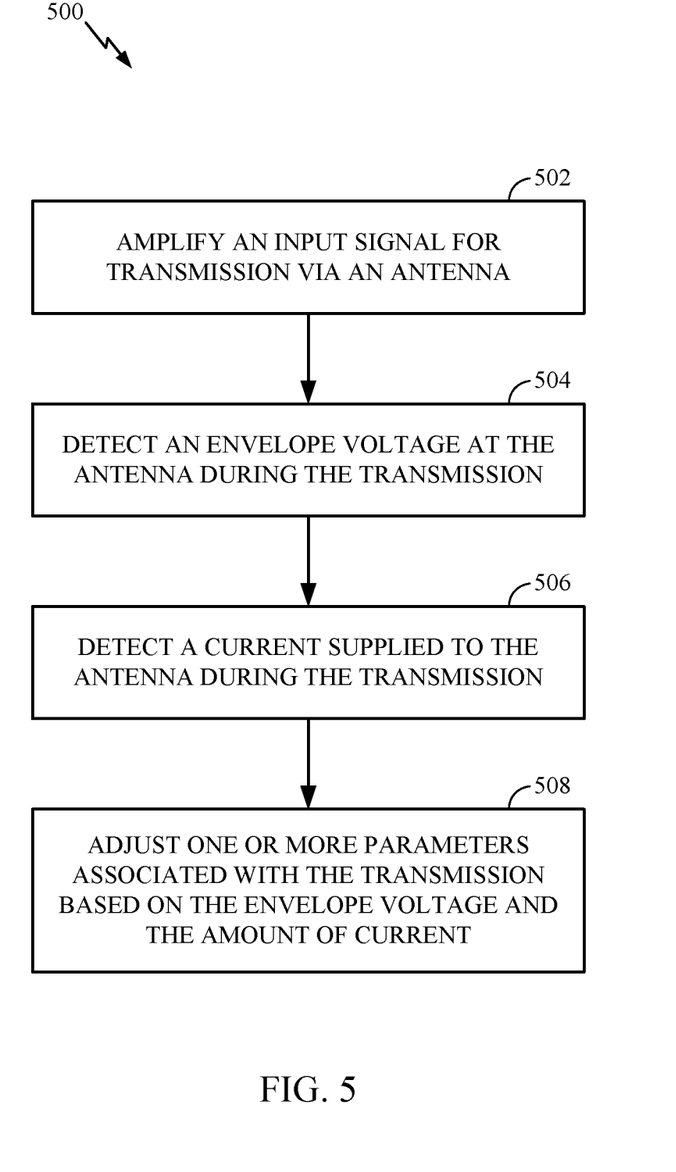
FIG. 5 is a flow diagram illustrating example operations for wireless communication, in accordance with certain aspects of the present disclosure.

FIG. 5 is a flow diagram illustrating example operations 500 for wireless communication, in accordance with certain aspects of the present disclosure. The operations 500 may be performed by a circuit, such as the polar transmitter 400, and in some cases a controller such as the controller 230.

The operations 500 begin, at block 502, by amplifying (e.g., via PA 410) an input signal for transmission via an antenna (e.g., antenna 420). At block 504, an envelope voltage is detected (e.g., via voltage envelope detector 430) at the antenna during the transmission, and at block 506, a current supplied to the antenna is detected (e.g., via the current detector 490) during the transmission. In certain aspects, the operations 500 may also include, at block 508, adjusting (e.g., via the controller 230) one or more parameters associated with the transmission based on the envelope voltage and the current. For example, in certain aspects, the operations 500 may include measuring a magnitude and an angle of a VSWR (e.g., a vector VSWR) based on the envelope voltage and the current, the one or more parameters being adjusted based on the magnitude and the angle of the VSWR.

In certain aspects, the input signal may be amplified via an amplifier. The detection of the current, at block 506, may include measuring a supply current to the amplifier. In certain aspects, detecting the current, at block 506, may include detecting (e.g., via voltage envelope detector 432) a voltage at an output of the amplifier. The current may be detected based on the voltage at the output of the amplifier and the voltage at the antenna.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for amplifying may include an amplifier, such as the PA 410. Means for detecting an envelope voltage may include a voltage envelope detector, such as the voltage envelope detector 430 and/or voltage envelope detector 432. Means for detecting a current may include a current detector, such as the current detector 490, or a voltage envelope detector such as the voltage envelope detector 432. Means for adjusting one or more parameters may include a controller, such as the controller 230. Means for measuring a VSWR may include a controller, such as the controller 230.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communication, comprising:
   an antenna terminal;
   an amplifier, wherein the amplifier comprises a power amplifier that is part of a polar transmitter;
   a matching network coupled between the antenna terminal and an output of the amplifier;
   a first voltage envelope detector coupled to a node between the antenna terminal and the matching network;
   a current detection circuit coupled to the amplifier;
   a magnitude modulator circuit coupled to a supply node of the amplifier; and
   a phase modulator circuit coupled to an input of the amplifier.

2. The apparatus of claim 1, wherein:
   the magnitude modulator circuit comprises an output coupled to the supply node of the amplifier; and
   the current detection circuit is coupled to a node between the magnitude modulator circuit and the supply node of the amplifier.

3. The apparatus of claim 2, wherein the current detection circuit is configured to detect a current supplied to the amplifier by the magnitude modulator circuit.

4. The apparatus of claim 3, wherein the magnitude modulator circuit comprises a low dropout (LDO) regulator, the current detection circuit being a replica output stage of the LDO regulator.

5. The apparatus of claim 1, wherein the current detection circuit comprises a second voltage envelope detector coupled to a node between the output of the amplifier and the matching network.

6. The apparatus of claim 5, wherein the current detection circuit is configured to detect a current supplied to the antenna terminal based on envelope voltages detected by the first voltage envelope detector and the second voltage envelope detector.

7. The apparatus of claim 1, wherein the matching network is a pi network comprising two shunt capacitive elements and a series inductive element coupled between the two shunt capacitive elements.

8. The apparatus of claim 1, wherein the amplifier and the matching network are part of the polar transmitter, the apparatus further comprising a controller configured to adjust one or more parameters of the polar transmitter based on a voltage detected by the first voltage envelope detector and a current detected by the current detection circuit.

9. The apparatus of claim 8, wherein the controller is configured to measure a magnitude and an angle of a voltage standing wave ratio (VSWR) of the polar transmitter, the one or more parameters being adjusted based on the magnitude and the angle of the VSWR.

10. A method for wireless communication, comprising:
    generating a magnitude signal and a phase signal based on a baseband signal;
    amplifying an input signal for transmission via an antenna, wherein the input signal is amplified to generate an amplified signal having a magnitude corresponding to the magnitude signal and a phase corresponding to the phase signal;
    detecting an envelope voltage at the antenna during the transmission;
    detecting a current supplied to the antenna during the transmission; and
    adjusting one or more parameters associated with the transmission based on the envelope voltage and the current.

11. The method of claim 10, further comprising:
    measuring a magnitude and an angle of a voltage standing wave ratio (VSWR) based on the detected envelope voltage and the current, the one or more parameters being adjusted based on the magnitude and the angle of the VSWR.

12. The method of claim 10, wherein the input signal is amplified via an amplifier, the detection of the current comprising measuring a supply current to the amplifier.

13. The method of claim 10, wherein the input signal is amplified via an amplifier, the detecting the current comprising detecting another envelope voltage at an output of the amplifier, wherein the current being detected is based on the other envelope voltage at the output of the amplifier and the envelope voltage at the antenna.

14. The method of claim 10, wherein the baseband signal comprises an in-phase component and a quadrature component.

15. An apparatus for wireless communication, comprising:
    means for generating a magnitude signal and a phase signal based on a baseband signal;
    means for amplifying an input signal for transmission via an antenna, wherein the input signal is amplified to generate an amplified signal having a magnitude corresponding to the magnitude signal and a phase corresponding to the phase signal;
    means for detecting an envelope voltage at the antenna during the transmission;
    means for detecting a current supplied to the antenna during the transmission; and
    means for adjusting one or more parameters associated with the transmission based on the envelope voltage and the current.

16. The apparatus of claim 15, wherein the means for adjusting the one or more parameters comprises means for measuring a magnitude and an angle of a voltage standing wave ratio (VSWR) based on the detected envelope voltage and the current, the means for adjusting being configured to adjust the one or more parameters based on the magnitude and the angle of the VSWR.

17. The apparatus of claim 15, wherein the means for detecting the current comprises means for detecting a supply current supplied to the means for amplifying.

18. The apparatus of claim 15, wherein the means for detecting the current comprises means for detecting another envelope voltage at an output of the means for amplifying, wherein the means for detecting the current is configured to detect the current based on the other envelope voltage at the output of the means for amplifying and the envelope voltage at the antenna.

19. The apparatus of claim 15, wherein the baseband signal comprises an in-phase component and a quadrature component.

\* \* \* \* \*